United States Patent
Allman et al.

(10) Patent No.: US 6,504,202 B1
(45) Date of Patent: Jan. 7, 2003

(54) INTERCONNECT-EMBEDDED METAL-INSULATOR-METAL CAPACITOR

(75) Inventors: Derryl D. J. Allman, Camas, WA (US); Kenneth Fuchs, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/496,971

(22) Filed: Feb. 2, 2000

(51) Int. Cl.[7] .................. H01L 29/76; H01L 29/94; H01L 31/062; H01L 31/113; H01L 31/119
(52) U.S. Cl. .............. 257/303; 257/304; 257/306; 257/308; 257/311; 257/758
(58) Field of Search ................. 257/306, 307, 257/308, 303, 304, 311, 758

(56) References Cited

U.S. PATENT DOCUMENTS

| | | |
|---|---|---|
| 4,437,139 A | 3/1984 | Howard |
| 4,912,535 A | 3/1990 | Okumura |
| 5,095,346 A | 3/1992 | Bae et al. |
| 5,101,251 A | 3/1992 | Wakamiya et al. |
| 5,142,437 A | 8/1992 | Kammerdiner et al. |
| 5,155,657 A | 10/1992 | Oehrlein et al. |
| 5,187,637 A | 2/1993 | Embree |
| 5,195,018 A | 3/1993 | Kwon et al. |
| 5,240,871 A | 8/1993 | Doan et al. |
| 5,273,925 A | 12/1993 | Yamanaka |
| 5,381,365 A | 1/1995 | Ajika et al. |
| 5,394,000 A | 2/1995 | Ellul et al. |
| 5,434,812 A | 7/1995 | Tseng |
| 5,436,186 A | 7/1995 | Hsue et al. |
| 5,451,551 A | 9/1995 | Krishnan et al. |
| 5,479,316 A | * 12/1995 | Smrtic et al. ............ 361/322 |
| 5,494,854 A | 2/1996 | Jain |
| 5,494,857 A | 2/1996 | Cooperman et al. |
| 5,497,017 A | 3/1996 | Gonzales |
| 5,605,857 A | 2/1997 | Jost et al. |
| 5,654,581 A | 8/1997 | Radosevich et al. |
| 5,702,990 A | 12/1997 | Jost et al. |

(List continued on next page.)

FOREIGN PATENT DOCUMENTS

| | | |
|---|---|---|
| JP | 60253265 | 12/1985 |
| JP | 63048856 | 3/1988 |
| JP | 63087761 | 4/1988 |

OTHER PUBLICATIONS

Peter Van Zant, Microchip Fabrication—A Practical Guide to Semiconductor Processing, Third Edition, pp. 374 and 379.

Arjun Kar–Roy, et al., High Density Metal Insulator Metal Capacitors Using PECVD Nitride for Mixed Signal and RF Circuits, Jun. 1999, pp. 245–247.

Primary Examiner—Eddie Lee
Assistant Examiner—Jesse A. Fenty
(74) Attorney, Agent, or Firm—John R. Ley, LLC

(57) ABSTRACT

A metal-insulator-metal capacitor is embedded in an interconnect layer of an integrated circuit (IC). The interconnect layer has a cavity, and the capacitor is formed in the cavity with one of the plates of the capacitor integral with a conductive layer of the interconnect layer, so the capacitor plate electrically communicates with the interconnect layer. The interconnect layer has multiple conductive layers, including a layer, such as aluminum, that is subject to deformation at certain temperatures during fabrication of the IC, and the cavity extends through this layer. A remaining conductive layer of the interconnect layer defines one of the capacitor plates, and a dielectric layer and another capacitor plate are formed thereon within the cavity. Via interconnects of about the same length electrically connect to the top plate and through the interconnect layer to the bottom plate.

20 Claims, 10 Drawing Sheets

U.S. PATENT DOCUMENTS

| | | |
|---|---|---|
| 5,708,303 A | 1/1998 | Jeng |
| 5,736,457 A | 4/1998 | Zhao |
| 5,739,579 A | 4/1998 | Chiang et al. |
| 5,742,471 A | 4/1998 | Barbee, Jr. et al. |
| 5,747,382 A | 5/1998 | Huang et al. |
| 5,753,948 A | 5/1998 | Nguyen et al. |
| 5,767,541 A | 6/1998 | Hanagasaki |
| 5,846,876 A | 12/1998 | Bandyopadhyay et al. |
| 5,913,141 A | 6/1999 | Bothra |
| 5,915,203 A | 6/1999 | Sengupta et al. |
| 5,925,932 A | 7/1999 | Tran et al. |
| 5,926,359 A | 7/1999 | Greco et al. |
| 5,976,928 A | 11/1999 | Kirlin et al. |
| 5,981,374 A | 11/1999 | Dalal et al. |
| 6,004,839 A * | 12/1999 | Hayashi et al. .............. 438/210 |
| 6,025,226 A | 2/2000 | Gambino et al. |
| 6,057,571 A | 5/2000 | Miller et al. |
| 6,069,051 A | 5/2000 | Nguyen et al. |
| 6,081,021 A | 6/2000 | Gambino et al. |
| 6,100,155 A | 8/2000 | Hu |
| 6,180,976 B1 | 1/2001 | Roy |
| 6,197,650 B1 | 3/2001 | Wu |
| 6,262,446 B1 * | 7/2001 | Koo et al. ................... 257/296 |
| 6,399,974 B1 * | 6/2002 | Ohtsuki ....................... 257/296 |
| 6,404,001 B2 * | 6/2002 | Koo et al. ................... 257/296 |
| 6,424,011 B1 * | 7/2002 | Assaderaghi et al. ....... 257/350 |
| 6,278,172 B1 * | 8/2002 | Tominaga ................... 257/535 |

* cited by examiner

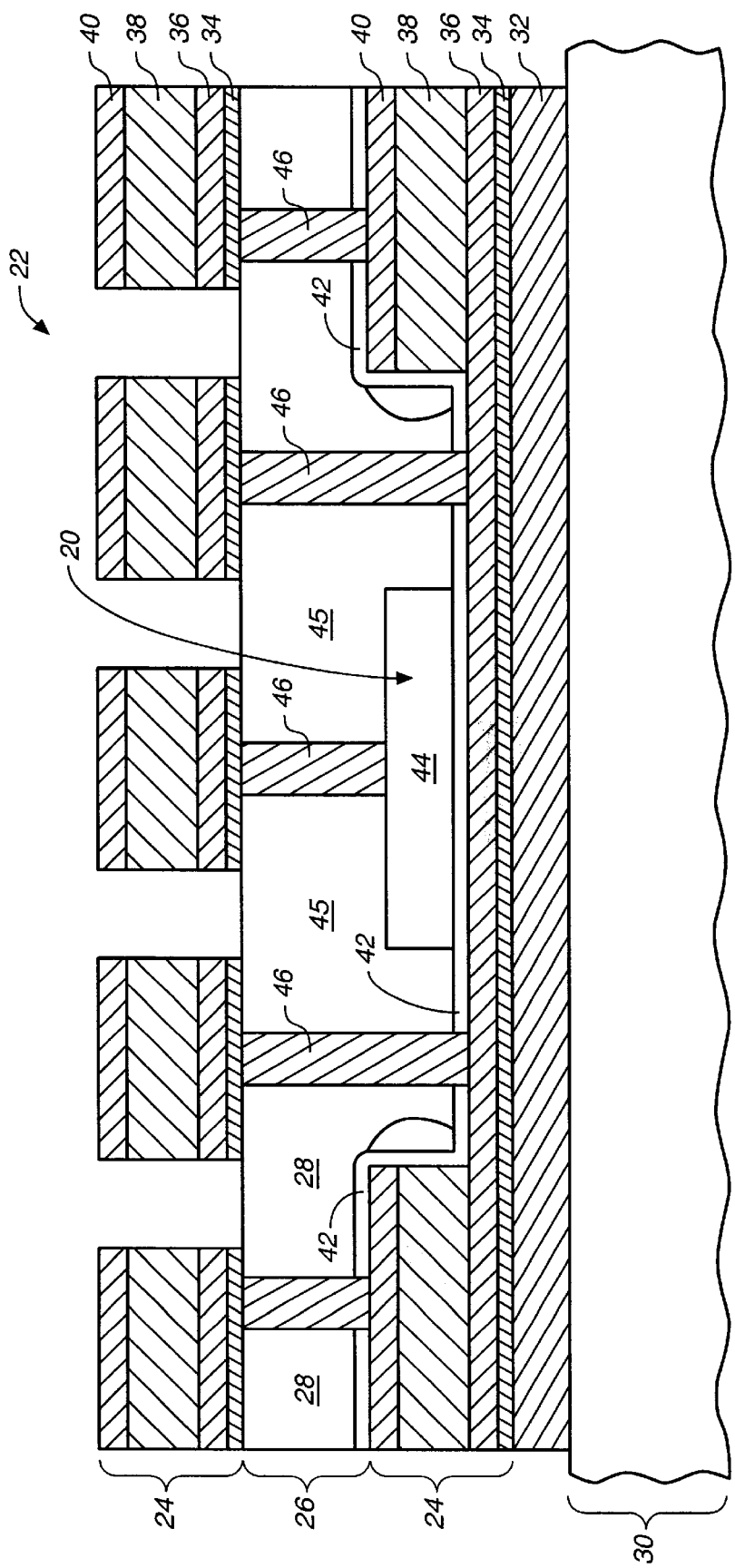
FIG._1

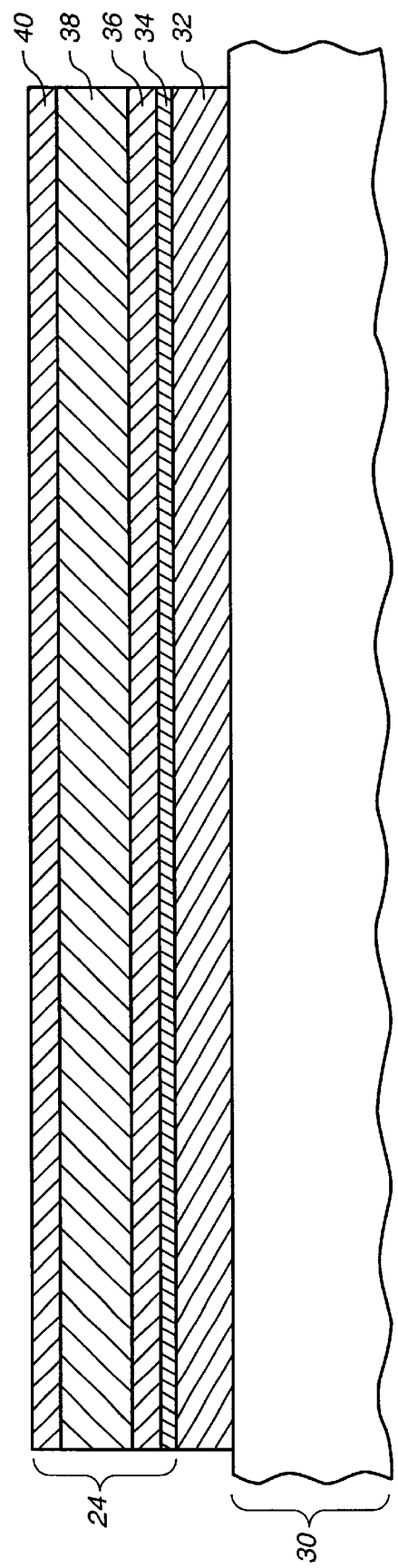

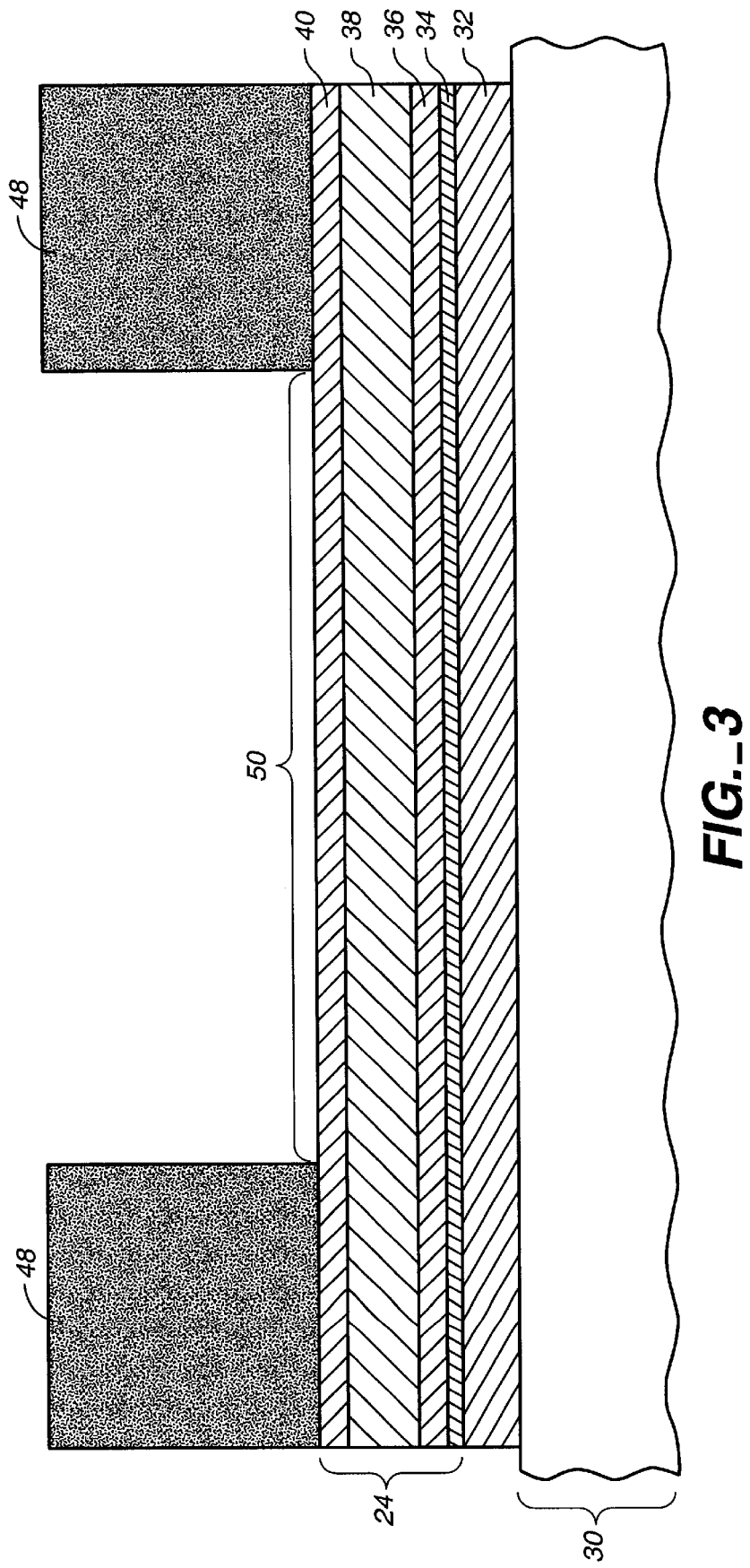
FIG._3

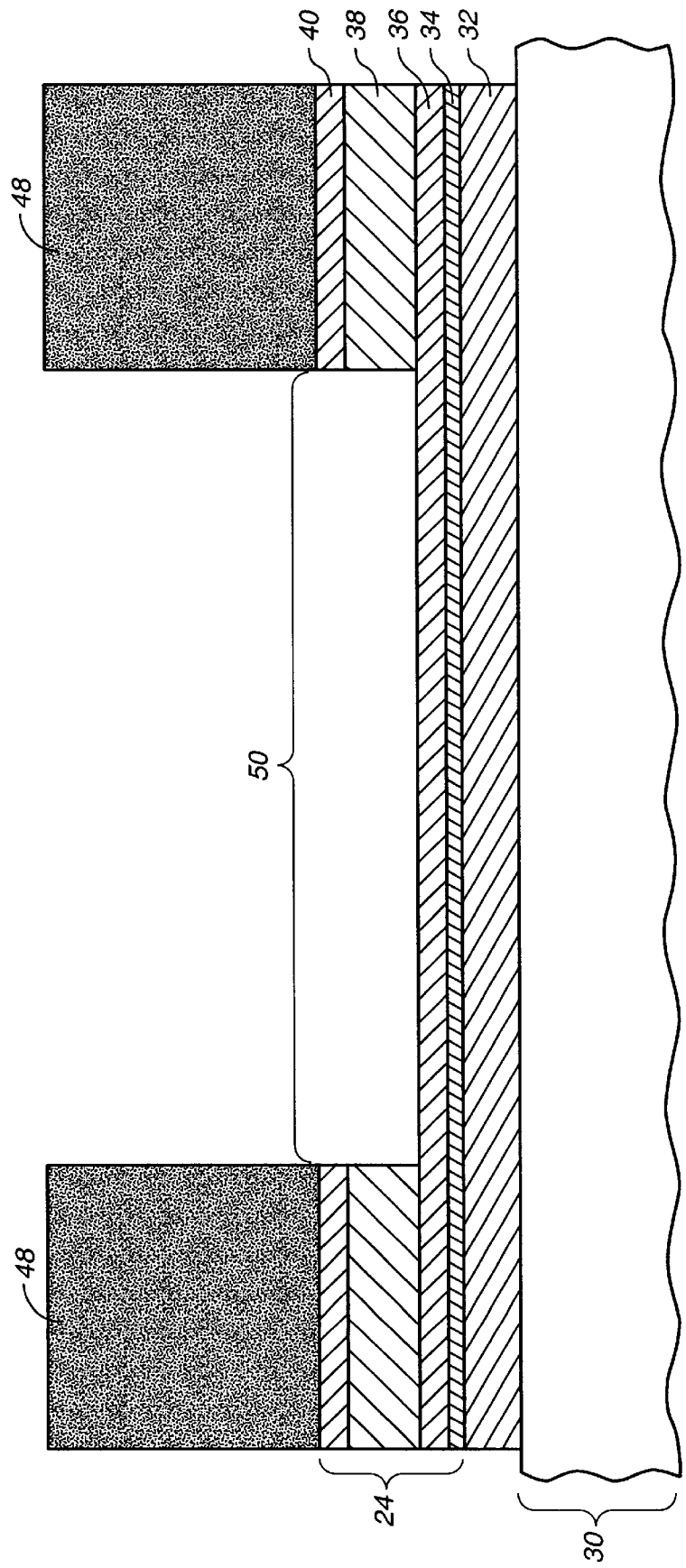
FIG._4

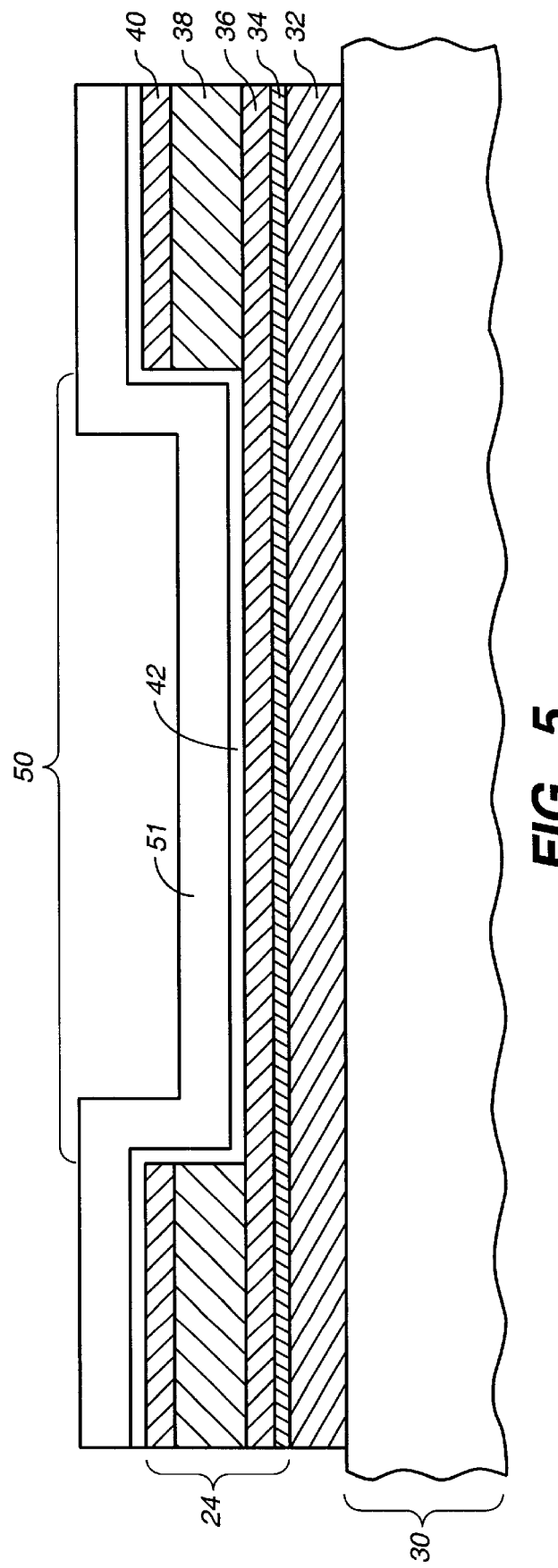
FIG._5

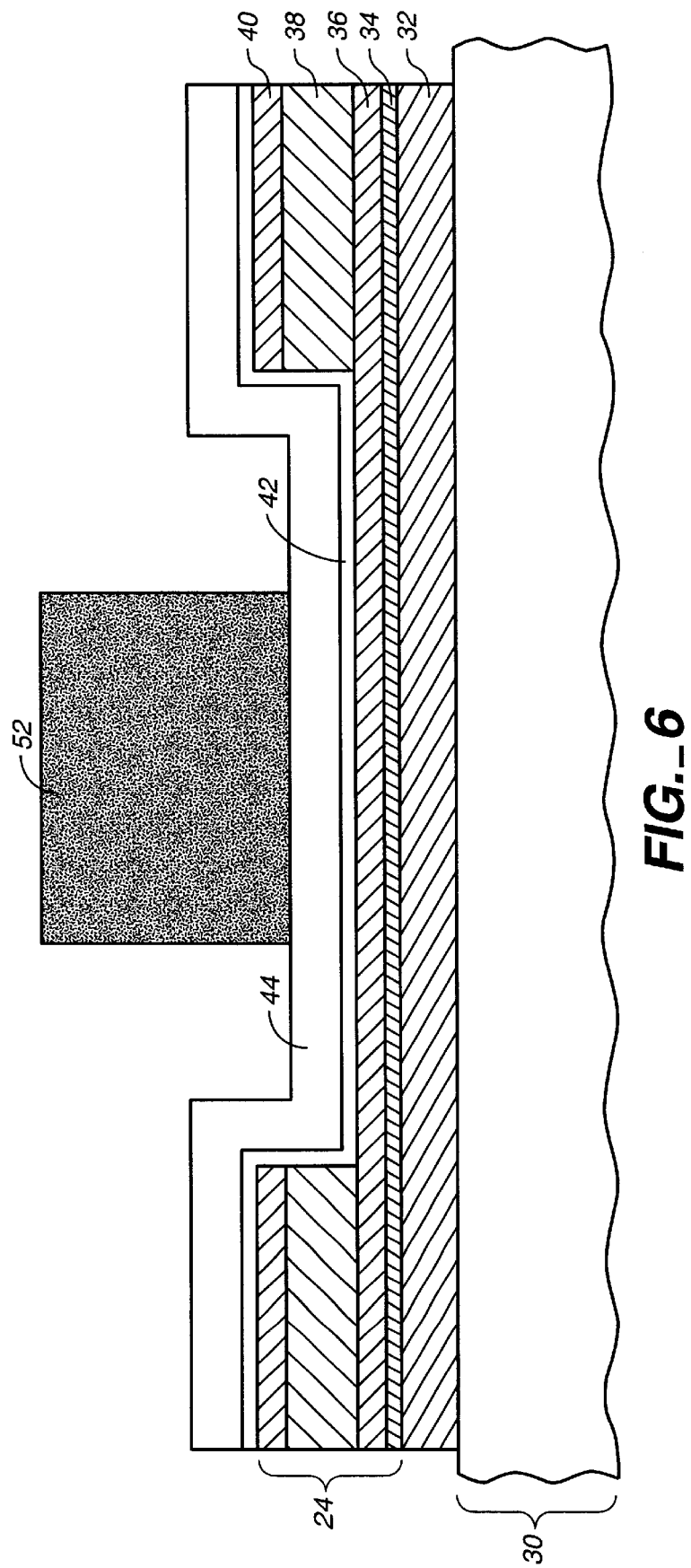
FIG._6

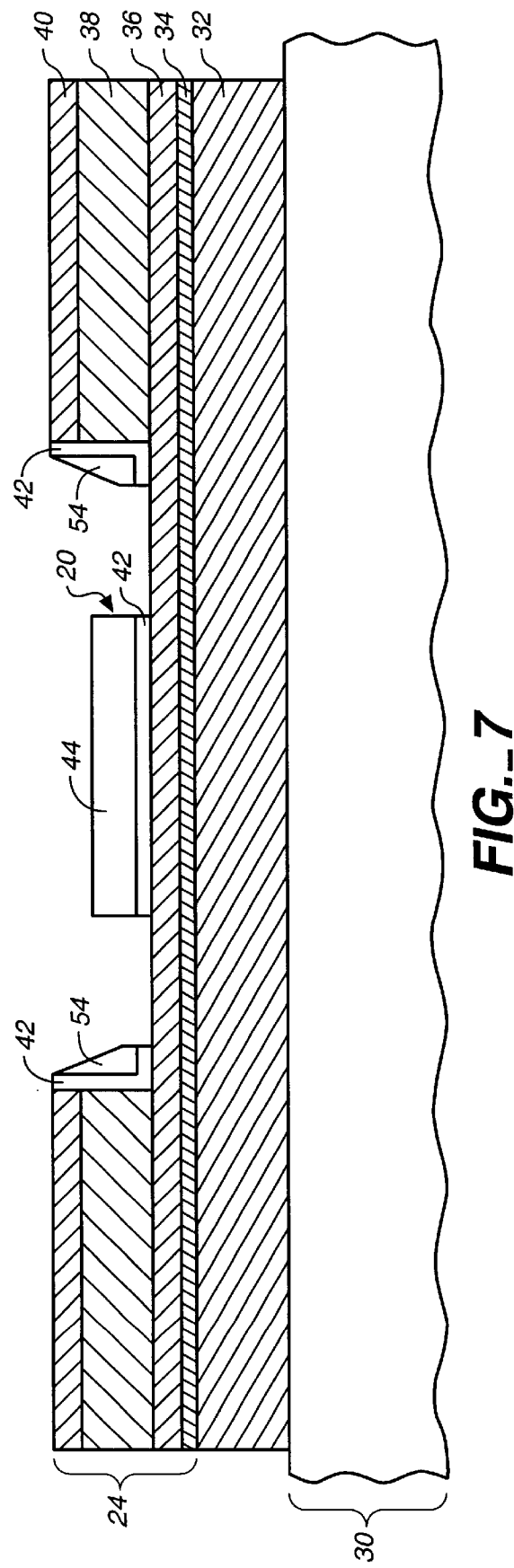
FIG._7

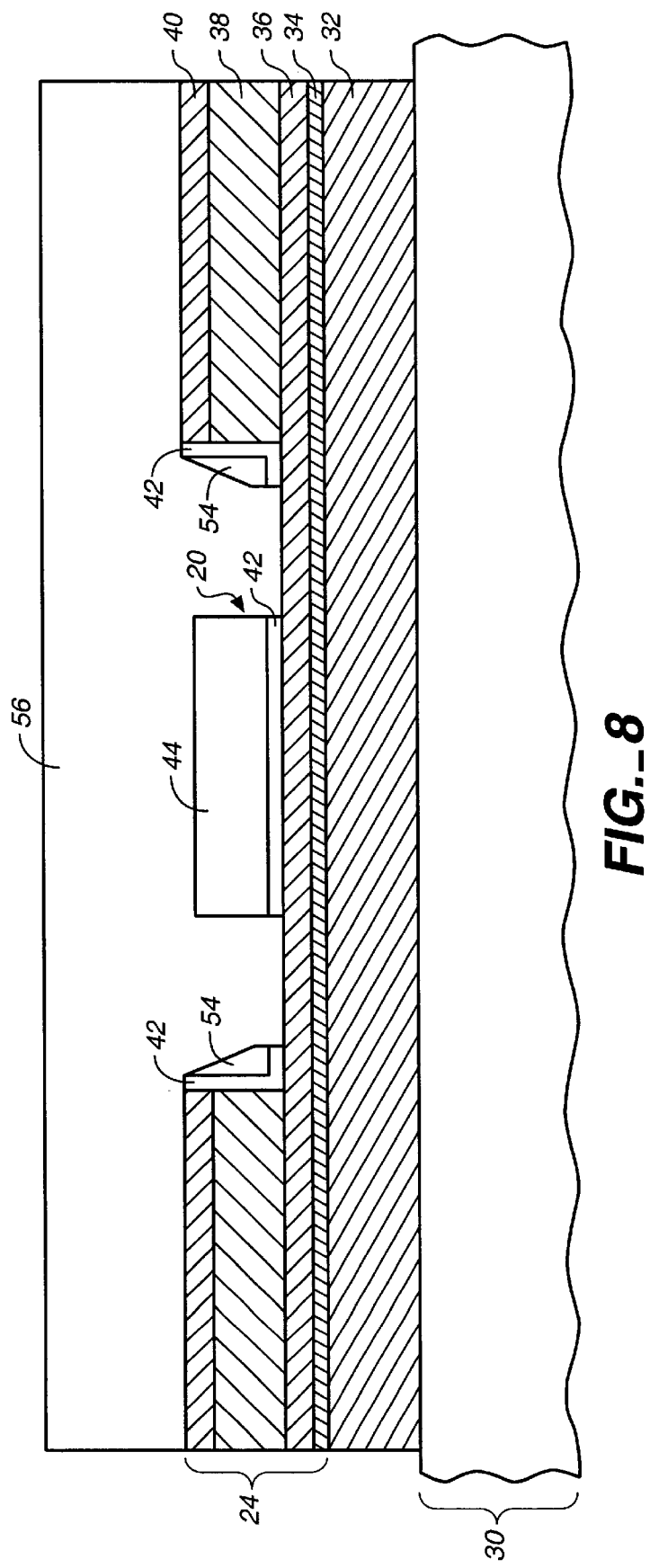
FIG._8

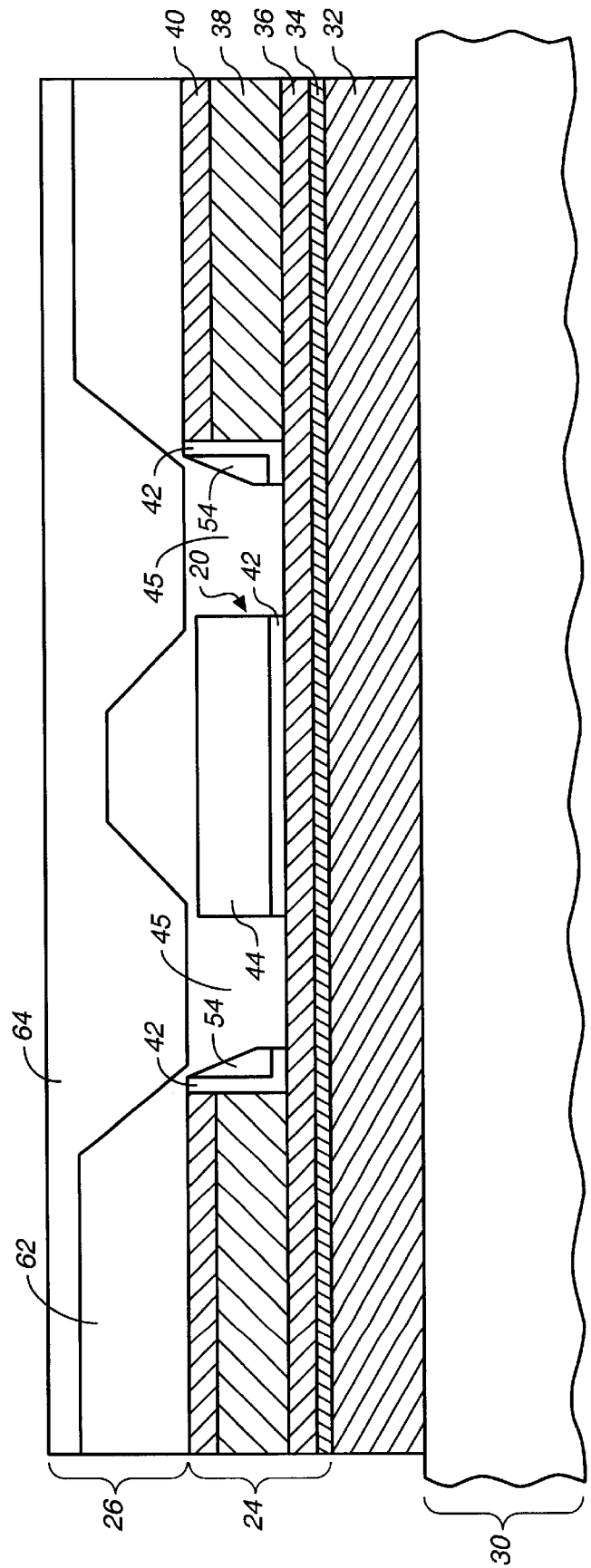
FIG._9

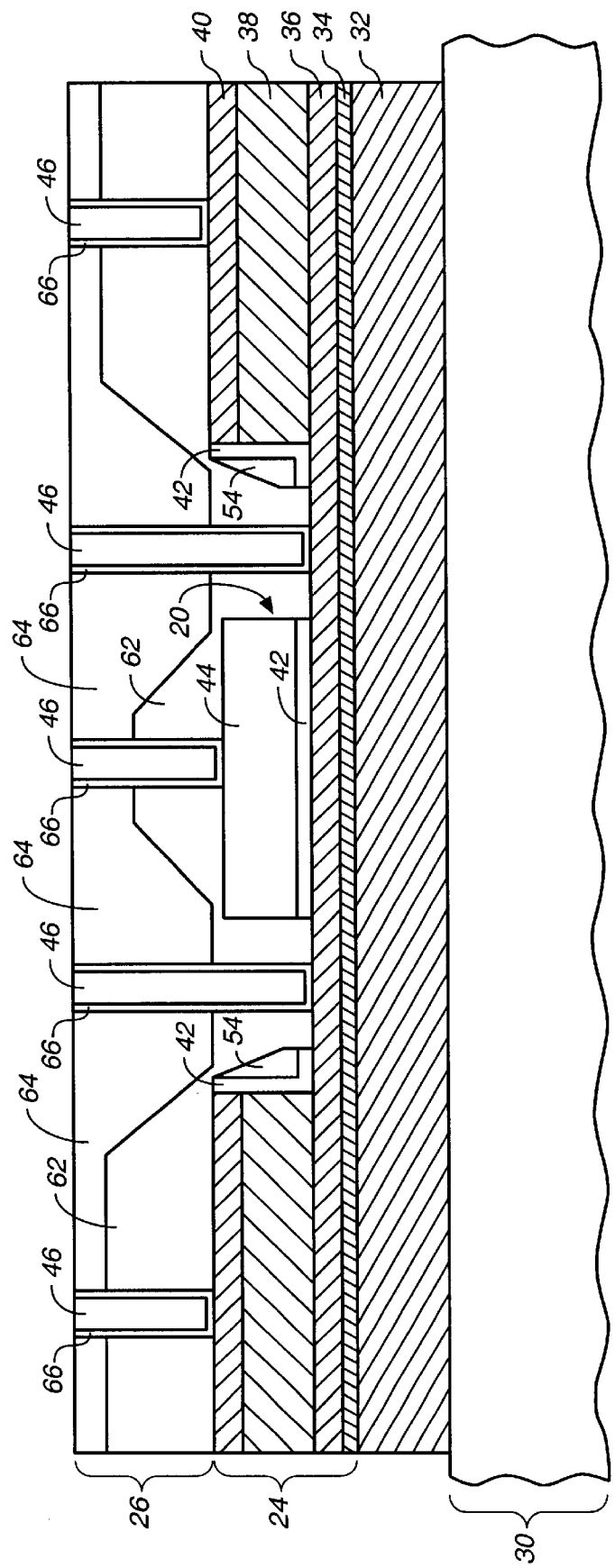
FIG._10

INTERCONNECT-EMBEDDED METAL-INSULATOR-METAL CAPACITOR

CROSS-REFERENCE TO RELATED INVENTIONS

This invention is related to the following inventions, all of which are assigned to the assignee of the present invention: High Aspect Ratio Metal-to-Metal Linear Capacitor for an Integrated Circuit, U.S. patent application Ser. No. 09/052,851, filed Mar. 31, 1998; Method of Electrically Connecting and Isolating Components with Vertical Elements Extending between Interconnect Layers in an Integrated Circuit, U.S. patent application Ser. No. 09/052,793, filed Mar. 31, 1998; Vertical Interdigitated Metal-Insulator-Metal Capacitor for an Integrated Circuit, U.S. patent application Ser. No. 09/219,655, filed Dec. 23, 1998; Method of Forming and Electrically Connecting a Vertical Interdigitated Metal-Insulator-Metal Capacitor Extending between Interconnect Layers in an Integrated Circuit, U.S. patent application Ser. No. 09/221,023, filed Dec. 23, 1998; Interconnect-Integrated Metal-Insulator-Metal Capacitor and Method of Fabricating Same, U.S. patent application Ser. No. 09/559,934, filed concurrently herewith; Capacitor with Multiple-Component Dielectric and Method of Fabricating Same, U.S. patent application Ser. No. 09/573,123, filed concurrently herewith; Capacitor with Stoichiometrically Adjusted Dielectric and Method of Fabricating Same, U.S. patent application Ser. No. 09/573,137, filed concurrently herewith; and Encapsulated-Metal Vertical-Interdigitated Capacitor and Damascene Method of Manufacturing Same, U.S. patent application Ser. No. 95/525,489, filed concurrently herewith. The disclosures of these aforementioned U.S. patent applications are hereby incorporated by this reference.

FIELD OF THE INVENTION

This invention relates to electronic integrated circuits (ICs) of the type having multiple layers of metal interconnects formed on top of one another on a substrate of the IC. More particularly, the present invention relates to a new and improved metal-insulator-metal capacitor which is formed within an interconnect layer of the IC to create a more reliable capacitor, to simplify the process of the capacitor fabrication, and to facilitate the formation of multiple layers of interconnects on the IC, among other things.

BACKGROUND OF THE INVENTION

The ongoing advances in the field of fabricating miniaturized electronic integrated circuits (ICs) has involved the fabrication of multiple layers of interconnects. Interconnects refer to the layer of separate electrical conductors which are formed on top of the substrate and which connect various functional components of the substrate and other electrical connections to the IC. Electrical connections between the interconnect layers and the functional components on the substrate are achieved by "via interconnects," which are post-like or plug-like vertical connections between the conductors of the interconnect layers and the substrate. Presently manufactured ICs often have five or more interconnect layers formed on top of the substrate.

Only a relatively short time ago, it was impossible or very difficult to construct an IC with more than one or two layers of interconnects. The topology variations created by forming multiple layers on top of one another resulted in such significant depth of focus problems with lithographic processes that any further additions of layers were nearly impossible to achieve. However, recent advances in semiconductor fabrication planarization techniques, such as chemical mechanical polishing (CMP), have been successful in smoothing relatively significant variations in the height or topography of each interconnect layer. As a result of the smoothing, or planarization, conventional lithographic processes are repetitively employed without significant limitation to form considerably more layers of interconnects than had previously been possible.

The multiple interconnect layers consume volume within the IC, although they do not necessarily consume additional substrate surface area. Nevertheless, because surface area and volume are critical considerations in ICs, attention has been focused upon the effective use of the space between the interconnect layers. Normally the space between the interconnect layers is occupied by an insulating material, known as an interlayer dielectric (ILD) or intermetal dielectric (IMD), to insulate the electrical signals conducted by the various conductors of the interconnect layers from each other and from the functional components in the underlying substrate.

One effective use for the space between the interconnect layers is to incorporate capacitors between the interconnect layers in the IMD insulating material separating the interconnect layers. These capacitors form part of the functional components of the IC. Previously, capacitors were constructed in the first layers of IC fabrication immediately above the substrate alongside other structures, such as transistors, so the capacitors were formed of generally the same material used to construct the other functional components, such as polysilicon. Capacitors formed of these materials are generally known as poly-plate capacitors. The aforementioned inventions described in the referenced U.S. patent applications focus on different techniques for combining capacitors with the conductors of the interconnect layers to achieve desirable functional effects within the IC.

Because the conductors of the interconnect layers are metal in construction, the capacitors formed between the interconnect layers are preferably of a metal-insulator-metal (MIM) construction to take advantage of processing steps and performance enhancements. A MIM capacitor has metal plates, usually formed on the metal conductors of the interconnect layers. Because metal fabrication is required for the conductors of the interconnect layers, the simultaneous or near-simultaneous formation of the metal capacitor plates is readily accomplished without significant additional process steps and manufacturing costs. The fifth above identified invention describes a technique for the simultaneous formation of one of the metal capacitor plates integrated with the conductors of the interconnect layers. Thus, at least part of the capacitor is readily fabricated without significant additional process steps and manufacturing costs.

Forming other parts of the capacitor between the interconnects does, however, require additional process steps. The additional process steps involve forming the components of the capacitor in the IMD insulating material and connecting the capacitor components to the conductors of the interconnect layers. In comparison, if the capacitor was not formed in the interlayer insulating material, the entire IMD layer could be conventionally formed. Furthermore, for this method, the via interconnects between the interconnect layers would all have approximately the same depth or height dimension, thereby facilitating the construction of the via interconnects through the IMD insulating material and the formation of the interconnects within the vias. With the presence of the capacitor in the IMD layer, however, the via interconnects do not all have the same depth because the top of the capacitor is higher than the top of the interconnect layer, upon which the capacitor sits. For this case, the selectivity of the IMD material has to be sufficiently high relative to the top electrode material, or the top electrode has to be sufficiently thick, to prevent the via etch process from etching through the top electrode and shorting out the capacitor. In addition, the orientation of the capacitor between the interconnects increases the thickness of the IMD insulating material between the interconnect layers and presents a bulge in the IMD insulating material deposited on top of the capacitor, thereby requiring additional effort, time and/or processing steps in performing the planarization steps to achieve a sufficiently planar surface for the formation of the next vertically-spaced interconnect layer. The increased thickness of the IMD insulating material also consumes additional insulating material, prolongs the fabrication process and increases the variation in IMD thickness, resulting in degraded performance of the IC and/or an increase in defectivity of the ICs thus manufactured. Furthermore, an increased thickness of the IMD increases the overall volume of the IC. In addition to the greater complexity in IC fabrication processing, further design rules must be added to equalize the pattern density of the interconnect layer to prevent formation of topography that cannot be planarized in a conventional CMP process.

It is with respect to these and other background considerations that the present invention has evolved.

SUMMARY OF THE INVENTION

One aspect of the present invention relates to the discovery that the typical process thermal cycles required for insulator densification, dielectric deposition, alloying (transistor passivation) and the formation of the interconnects in layers may diminish or destroy the functionality of capacitors connected to the interconnect conductors. There is a relatively large thermal expansion mismatch between aluminum layer components of the interconnect layers and the interlayer insulating material. The normal temperature excursions inherent in the thermal fabrication processes may cause metal deformation known as a "hillock" in the softer aluminum layer of the interconnect. If the hillock is significant in size, it will penetrate through the dielectric material between the plates of the MIM capacitor, thereby shorting together the capacitor plates. Even if the size of the hillock is not significant enough to short the capacitor plates, the dielectric between the capacitor plates at the location of the hillock is highly stressed, increasing the leakage current, which diminishes the value of the capacitance and may eventually result in an early failure of the IC. In the cases of diminished capacitance and shorted capacitor plates, the functionality of part or all of the IC is either destroyed or greatly diminished.

The new and improved MIM capacitor of the present invention, and the method of fabricating it, are effective in overcoming the problem associated with hillock formation and its resulting detrimental impact on the capacitors formed, as well as permitting vias to be formed through the IMD insulating material to both the capacitor and the interconnect layer at substantially the same depth and dimension, allowing the IMD insulating material to assume a normal height over the capacitor preventing the formation of bulges in the IMD layer requiring extensive planarization steps to smoothen. This process also eliminates the need for additional design rules associated with interconnect pattern density equalization. The plates of the capacitor do not utilize or require the aluminum layer within the interconnect conductors, thereby avoiding the problem of thermal mismatch and hillock formation. The capacitor itself is embedded within the thickness of the conductor interconnect layer, thereby avoiding the difficulties associated with forming the capacitor above the interconnect layer in the IMD insulating material. By embedding the capacitor within the thickness of the interconnect layer, the fabrication process is simplified by reducing the amount of planarization required, reducing the number of fabrication steps connected solely with forming the capacitor, and allowing the IMD insulating material to be formed in a more uniform thickness and/or reduced thickness because the structure of the capacitor itself does not need to be accommodated in the IMD layer between the interconnect layers. This process also prevents variability in IMD thickness, resulting in a more precise interconnect delay model and in performance improvements. The reduction in IMD variability also improves IC component fabrication yield from a wafer substrate. Furthermore, because the capacitor components are embedded within the interconnect layer, the height or level of the capacitor components may be made approximately the same as the height of the interconnect layer, thereby allowing the process of forming the holes for the via interconnects through the IMD to proceed uniformly throughout the IC structure without the added risks of damaging components of different heights, as would be the case with the capacitor formed in the interlayer insulating material between the distinct interconnect layers.

These and other improvements are achieved in an IC that has a substrate overlaid by an interconnect layer with a cavity in the interconnect layer and a capacitor embedded within the cavity. Additional preferred aspects of the present invention relate to the interconnect layer preferably including upper, middle and lower conductive layers, and the cavity being located principally within the middle conductive layer, which may be subject to deformation under temperature changes due to thermal processing of the IC, as may occur in an aluminum layer. Preferably, the capacitor comprises a pair of plates, e.g. top and bottom plates, separated by a capacitor dielectric material with one of the plates formed by a portion of the interconnect layer in the cavity. For example, the bottom plate is preferably integral with the lower conductive layer of the interconnect layer. Additionally, it is preferable that the bottom plate of the capacitor be about level with the lower conductive layer of the interconnect layer, and that the top plate be about level with or lower than the upper conductive layer. Where the interconnect layer comprises upper, middle and lower conductive layers, the cavity preferably extends through the upper and middle layers, and the capacitor bottom plate is formed by a portion of the lower conductive layer. Alternatively, the bottom plate is electrically connected to the interconnect layer, and preferably, via interconnects connect to the top plate and to the next interconnect layer above the capacitor. Additionally, the bottom plate may be connected to the interconnect layer below through a previously formed via.

Another aspect of the present invention involves an embedded capacitor structure formed in an interconnect layer of an integrated circuit comprising a lower conductive layer of the interconnect layer and both an upper conductive layer and a top capacitor plate overlying the lower conductive layer and laterally offset from each other. Additional preferred aspects of this embodiment of the present invention relate to a top surface of the top plate being level with or lower than a top surface of the upper conductive layer. It is also preferable that the capacitor is located in the middle section of the conductive layer of the interconnect layer, made up primarily of aluminum. A bottom capacitor plate is preferably integral with or defined by the lower conductive layer. Via interconnects preferably connect directly to the top plate and electrically communicate indirectly to the bottom plate through the conductive layers of the interconnect layer. The via interconnects preferably extend through an intermetal dielectric (IMD) layer for connecting to another interconnect layer.

The previously mentioned and other improvements are achieved in a method of fabricating a capacitor in an IC having an interconnect layer overlying a substrate, which generally involves the steps of forming a cavity into the interconnect layer and forming a capacitor substantially within the cavity. Additional preferred method aspects of the present invention relate to forming the capacitor with substantially horizontal top and bottom plates and a horizontal layer of dielectric material therebetween, and locating the top plate level with or below an upper surface of the interconnect layer. Likewise, the bottom plate is preferably located at about a lower surface of the interconnect layer. The method preferably forms top and bottom capacitor plates with one of the plates formed as an integral portion of the interconnect layer. The cavity is preferably formed through an upper conductive layer of the interconnect layer, or through upper and middle conductive layers of the interconnect layer, and exposes a lower conductive layer, on which a dielectric layer is formed with a top capacitor plate formed on top of the dielectric layer. On top of the top plate and the upper conductive layer, an IMD layer is preferably formed, and via interconnects are formed therethrough to electrically contact the top plate and upper conductive layer. The via interconnects are preferably formed to about the same depth.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIG. 1 is a partial, vertical cross-sectional view of an integrated circuit having multiple interconnect layers and which incorporates an interconnect-embedded metal-insulator-metal (MIM) capacitor of the present invention.

FIGS. 2–10 are a series of partial, vertical cross-sectional views which illustrate a sequence of steps employed in the fabrication of the MIM capacitor shown in FIG. 1.

DETAILED DESCRIPTION

A capacitor 20 which embodies the present invention is incorporated in an integrated circuit (IC) 22 such as is shown in FIG. 1. The IC 22 is of the type having multiple layers 24 of electrical conductors known as interconnects. The electrical conductors of each interconnect layer 24 extend between and connect to the other functional components (not shown) of the IC 22. Each interconnect layer 24 is separated by a relatively thick layer 26 of interlayer dielectric (ILD) or intermetal dielectric (IMD) insulating material 28. The insulating material 28 of each IMD layer 26 electrically insulates the conductors of the interconnect layers 24 from one another and electrically insulates the other components within the IC 22 from one another.

The multiple interconnect layers 24 and IMD layers 26 are built or layered above one another and overlying a substrate 30 of the IC 22. The substrate 30 serves as the foundation for the IC and its functional components formed in and on the substrate 30. The functional components of the substrate 30 are exemplified by transistors and other semiconductor devices (not shown). The ability to fabricate an IC 22 with multiple interconnect layers 24 has been made possible by the present advanced state of planarization processes, for example chemical mechanical polishing (CMP).

A relatively thick ILD layer 32 of insulating dielectric material, such as silicon dioxide, is formed on the substrate 30 to support all of the above positioned interconnect layers 24 and their IMD material 28. The purpose of the ILD layer 32 is to insulate the interconnect layers 24 from the functional components or other interconnect conductors below. Via interconnects or other contacts (not shown) are typically formed in the ILD layer 32 to connect the interconnect layers 24 to the functional components in the substrate 30.

The construction of each interconnect layer 24 is conventional. Each interconnect layer 24 is preferably formed as a composite of a plurality of distinct metal layers 34, 36, 38 and 40, as shown, each of which is separately deposited during the course of constructing the interconnect layer 24. The layer 34 is preferably formed of titanium (Ti) and is approximately 200 angstroms thick. The layer 36 is preferably formed of titanium nitride (TiN), is approximately 480 angstroms thick, and is formed on top of the layer 34. The layer 38 is a relatively thick layer of aluminum or an aluminum alloy (such as including about 0.5% copper or other appropriate material), approximately 4200 angstroms thick. The aluminum layer 38 is formed on top of the titanium nitride layer 36. Lastly, another layer 40 of titanium nitride, approximately 700 angstroms thick, is preferably formed on top of the aluminum layer 38. Above the titanium nitride layer 40, another insulating dielectric layer 26 may be deposited to begin another interconnect layer 24.

The aluminum layer 38 is the primary electrical conductor of the two interconnect layers 24. To improve the reliability of the interconnect layer 24, the titanium nitride layers 36 and 40 are used to provide a good stress transition between the aluminum layer 38 and adjacent ILD layers 26 and 32. The titanium layer 34 is used to reduce any thin metallic oxide layer or contamination on a via (not shown) to interconnect layers below. The upper titanium nitride layer 40 also serves as an anti-reflection coating (ARC) reducing the reflection of light during the photolithography exposure process to improve the resolution of exposed patterns within photoresist material (not shown in FIG. 1) which is typically applied during photolithographic semiconductor fabrication processes.

As shown in FIG. 1, the capacitor 20 is preferably embedded within the space normally occupied by the vertical height dimension of the interconnect layer 24. To embed the capacitor 20 within the interconnect layer 24, substantially all of the layers 38 and 40 of the interconnect layer 24 must be removed to form a cavity 45 to make a space to be occupied by the capacitor 20. By eliminating the relatively thick aluminum layer 38, the distortion effects created by the thermal excursions during the fabrication process are circumvented, thereby eliminating and avoiding the problems of diminished capacitor reliability caused by the formation of hillocks in the aluminum layer 38.

The capacitor 20 is formed by a portion of the lower titanium nitride layer 36, a layer of capacitor dielectric material 42 deposited on the lower titanium layer 36, and a layer of titanium nitride 44 deposited on top of the capacitor dielectric material 42. The portion of the lower titanium nitride layer 36 of the interconnect layer 24 below the capacitor dielectric material 42 constitutes a lower plate of the capacitor 20. Preferably, the capacitor dielectric material 42 may be silicon nitride, although the capacitor dielectric material may be selected from other material, such as silicon dioxide or any other appropriate insulating material, to provide the desired dielectric and capacitor characteristics. Examples of dielectric materials suitable for use in the capacitor are described in the sixth and seventh above referenced U.S. patent applications. The thickness of the silicon nitride of the dielectric material 42 is preferably approximately 450 angstroms or other thickness as is appropriate for the capacitance desired and the dielectric material used. The layer 44 of titanium nitride on top of the layer 42 of capacitor dielectric material constitutes the other, upper plate of the capacitor 20. The upper capacitor plate layer of titanium nitride 44 is relatively thick, for example, approximately 1,400 angstroms. The titanium nitride layer 44 may be made even thicker so that the top of this layer 44 is generally at the same level as the top of the titanium nitride layer 40. In this manner, the via plasma etch process for forming the vias to both of these titanium nitride layers 40 and 44 will stop at the same level, thereby avoiding the weakening or destruction of components at shallower depths caused by additional plasma ion bombardment during the plasma etch process.

Because both the upper capacitor plate 44 and the lower capacitor plate 36 are formed of titanium nitride, a refractory metal, substantial additional resistance to deformation of the capacitor plates is obtained to resist the effects of thermal excursions during fabrication of the IC 22. This construction offers an advantage over other types of interlayer dielectric capacitors in which the plates of the capacitors are separately formed on top of components of the interconnect layers. When the plates are separately formed on top of the components of the interconnect layers, the thermal expansion of the interconnect layers, particularly the aluminum layer 38, may deform the capacitor plates, form hillocks, and destroy or diminish the effectiveness of the capacitor dielectric. Further still, the refractory metal plates 36 and 44 of the capacitor 20 cause it to exhibit linear response characteristics to electrical signals, thereby making the capacitor 20 more suitable or use as an analog circuit element or as a digital circuit element in the IC 22, if desired or required.

The IMD insulating material 28 covers the capacitor 20, and occupies the space 45 between the capacitor 20 and the horizontally adjoining components of the interconnect layer 24. Via interconnects 46 are formed through the IMD layer 26. Via interconnects 46 are through-hole electrical connections between the conductors of the vertically separated interconnect layers 24. The via interconnects 46 are shown as connecting conductors of the upper interconnect layer 24 to the upper capacitor plate 44 and either directly to the lower capacitor plate 36 (the titanium nitride layer 36 in the lower interconnect layer 24) or to the top titanium nitride layer 40 of the lower interconnect layer 24 itself for an indirect connection (the preferred connection) to the lower capacitor plate 36, as well as to the electrical conductors of the lower interconnect layer 24. The lower capacitor plate 36 can alternatively be connected to lower levels of components through a previously formed via (not shown) over which the capacitor 20 is formed. The locations of the via interconnects 46 are selected to achieve the necessary connections to the functional circuitry within the IC 22. The conductors of the interconnect layers 24 are separated from one another so that the functional connectivity is achieved. FIG. 1 does not illustrate functional connectivity, but instead simply illustrates the fact that connections through the via interconnects 46 are possible to all of the components of the capacitor 20 and between the interconnect layers 24.

After the layer 26 of IMD material 28 and the via interconnects 46 are formed, the upper surfaces of the IMD layer 26 and via interconnects 46 are planarized by appropriate conventional CMP procedures. Thereafter the upper interconnect layer 24 is formed.

The process of forming the interconnect-embedded MIM capacitor 20 shown in FIG. 1 is described in conjunction with steps of a fabrication process shown in FIGS. 2–10. Conventional fabrication techniques are used to deposit, pattern and etch each of the layers of materials shown and described in the following steps. Some of the process steps described hereunder for the formation of the MIM capacitor 20 are similar to the familiar process steps used in the construction of other structures in the underlying substrate.

The fabrication process begins at the stage shown in FIG. 2, where the conventional lower interconnect layer 24 has been formed by conventional techniques above the lower ILD layer 32 on top of the substrate 30. To begin the formation of the lower interconnect layer 24, the relatively thin titanium layer 34 is deposited on top of the ILD layer 32. The titanium nitride layer 36 is deposited on top of the titanium layer 34. The aluminum layer 38 is deposited on top of the titanium nitride layer 36, and the top titanium nitride layer 40 is deposited on top of the aluminum layer 38.

At the stage shown in FIG. 3, a photoresist layer 48 has been deposited on top of the titanium nitride layer 40 and a standard photolithography exposure and develop procedure has been used to remove the photoresist layer 48 to define an area 50 in which the capacitor 20 (FIG. 1) will be formed within the interconnect layer 24.

FIG. 4 illustrates that the top titanium nitride layer 40 and the aluminum layer 38 are etched away in the area 50 by using selective plasma etch procedures that stop on the lower titanium nitride layer 36 or that provide a signal indicating that the procedure has etched away the aluminum and has started on the bottom titanium nitride material. The photoresist layer 48 confines the etching process to the area 50. The titanium nitride layer 36 is not removed since it will form the lower capacitor plate of the capacitor 20.

At the stage shown in FIG. 5, the photoresist layer 48 (FIG. 4) has been removed by conventional processing steps, and the layer 42 of capacitor dielectric material and a layer 51 of titanium nitride are deposited by conventional techniques which may deposit these materials on the top as well as on the vertical sides of the exposed surfaces. The layer 51 will ultimately form the upper plate 44 of the capacitor 20 (FIG. 1). It is preferable, but not necessary, that the height of the titanium nitride layer 51, in the middle of the area 50, extend to about the same height as the top titanium nitride layer 40 of the interconnect layer 24 for the convenience of later forming via interconnects 46 to these two titanium nitride layers 40 and 51, as described below with reference to FIG. 10. Alternatively, the titanium nitride layer 51 could be considerably thinner, such as about 375–1000 angstroms thick, depending on the etch process which will later remove the unneeded portions of the layer 51 to the lateral sides of the upper capacitor plate 44.

The extent of the top capacitor plate 44 to be formed is defined by a deposited layer of photoresist material 52 which is patterned and etched back to expose all areas of the top titanium nitride layer 51 outside of the desired area of the top capacitor plate 44, as shown in FIG. 6. The horizontal extent of the photoresist material 52 is typically smaller than the area 50 (FIG. 5).

At the stage shown in FIG. 7, the top titanium nitride layer 51 has been etched outside of the region covered by the photoresist 52 (FIG. 6) by a conventional plasma process that etches the material with directionality that is substantially vertical to the horizontal surfaces of the resist layer 52 (FIG. 6). In this manner, outer edges of the top capacitor plate 44 remain substantially vertical. However, titanium nitride metal "stringers" or sidewall spacers 54 remain from the layer 51. These spacers 54 form no part of the capacitor 20 (FIG. 1) or interconnect layer 24, but do provide a smoother transition of the IMD layer 26 into the capacitor cavity, improving the final degree of subsequent planarity. The dielectric layer 42 may be etched away along with and in the same region as the titanium nitride layer 51. An alternative, as illustrated by FIG. 1, does not etch the dielectric layer 42 but instead leaves it in place to reduce electrical leakage of the capacitor 20. At the point in the process flow shown in FIG. 7, the structure of the capacitor 20 itself is essentially completed. The remainder of the process flow, as shown in FIGS. 1, 8, 9 and 10, generally involves patterning and etching the interconnects in the interconnect layer 24, and adding the IMD layer 26 and the via interconnects 46 therethrough to the capacitor plates 36 and 44 and the top titanium nitride layer 40 of the interconnect layer 24.

At the stage shown in FIG. 8, a photoresist layer 56 has been deposited onto the exposed surfaces. The photoresist layer 56 is patterned to define the metal interconnect layer 24 outside of the region of the capacitor 20, so that the interconnect layer 24 can be patterned and etched into conductor line segments outside the area of the capacitor 20. The photoresist layer 56 protects the capacitor 20 and the surrounding contact area of the bottom plate 36 during the metal plasma etching of the interconnect layer 24. After the conductors of the interconnect layer 24 have been formed, the photoresist layer 56 is removed. During the plasma etch procedure, the photoresist layer 56 is partially consumed. Having the capacitor 20 recessed below the top titanium nitride layer 40, however, prevents the top capacitor plate 44 from being exposed and damaged during this etch procedure.

Next, as shown in FIG. 9, the IMD layer 26 is deposited, preferably to a depth of about 18,000 angstroms, using a high density plasma (HDP) sequential deposition and sputtering operation, or other oxide deposition process. The spaces 45 between the capacitor top plate 44 and the spacers 54 (or the side of the aluminum and titanium nitride layers 38 and 40 if the spacers 54 are not present) are filled, along with any other gaps (not shown) between the conductors formed in the interconnect layer 24. Alternatively, the HDP deposition and sputtering operation may only partially complete the IMD layer 26 to form a lower HDP oxide portion 62, which then may be followed by an organic tetra ethyl ortho silicate (TEOS) deposition operation to complete the IMD layer 26 with an oxide cap 64. A TEOS deposition operation will fill the remaining vertical space in the IMD layer 26 more quickly than will an HDP deposition operation. Afterwards, the IMD layer 26 is cleaned and polished flat, or planarized, using an oxide CMP procedure, to provide a substantially flat surface on which to build the upper interconnect layer 24 (FIG. 1).

FIG. 10 illustrates that the via interconnects 46 are formed in the IMD layer 26 to the metal capacitor top plate 44 and the top titanium nitride layer 40 of the interconnect layer 24. Alternatively, via interconnects 46 may also be formed to the capacitor bottom plate 36 to provide a direct connection to the bottom plate 36, as shown, but connections to the top titanium nitride layer 40 of the interconnect layer 24 also provide sufficient contacts to the bottom plate 36 through the interconnect layer 24. Additionally, by forming via interconnects 46 to connect to the top layers of the interconnect layer 24, instead of to the bottom plate 36, the via etch process can form these via interconnects 46 and the via interconnects 46 connecting to the top capacitor plate 44 to about the same depth, and thereby prevent the etch process from bombarding the top of the higher layer 40 or 44 while still etching a via 46 to the lower layer 36. The via interconnects 46 are formed using conventional photolithography techniques to define the locations of the via interconnects 46, followed by a plasma etch to create holes through the IMD layer 26. The via interconnects 46 are lined with an appropriate thin layer of liner material 66, such as a thin film of titanium followed by a film of titanium nitride, on the bottom and sidewalls of the via interconnects 46 and then filled with tungsten or other metal, followed by a CMP process so that the metal in the via interconnects 46 and any metal that covered the IMD layer 26 are polished back to the top surface of the IMD layer 26. Afterwards, the layers of the top interconnect layer 24 (FIG. 1) are deposited in a manner similar to the formation of the lower interconnect layer 24. The top interconnect layer 24 is then defined and etched to make the desired contacts to the lower interconnect layer 24 and the capacitor 20.

Although the capacitor 20 is shown and described herein as being formed in the top of the lower interconnect layer 24, it is possible in an appropriate situation to invert the general structure of the capacitor 20 and form the capacitor 20 in the bottom of the upper interconnect layer 24. In this situation, the capacitor bottom plate is formed in a cavity in the underside of the interconnect layer, and the top metal layer of the interconnect layer forms the capacitor top plate. Appropriate via connections may then be provided to other interconnect layers either above or below the interconnect layer with the embedded capacitor.

The MIM capacitor 20 and its method of fabrication provide a capacitor that is disposed in the interconnect layers, instead of in the substrate of the IC 22, but does not add to the overall volume of the IC 22 since the capacitor 20 is embedded within an interconnect layer 24, instead of between two interconnect layers where the insulator layer 26 may have to be made thicker to accommodate a capacitor therein. Furthermore, the via connections between vertically adjacent interconnect layers and between the capacitor 20 and the next interconnect layer may be formed to about the same depth, simplifying the process of forming the via interconnects 46. Additionally, the structure of the capacitor 20 allows for a simplified method of fabrication that takes advantage of existing material in the interconnect layer 24 and of familiar fabrication processes. Many other advantages and improvements will be apparent upon gaining a full appreciation of the present invention.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiments set forth above.

The invention claimed is:

1. An integrated circuit (IC) comprising a substrate, a generally horizontally-extending interconnect layer, the interconnect layer having a vertical thickness extending between an upper surface and a lower surface of the interconnect layer, first and second layers of intermetal dielectric insulating material (IMD) contacting opposite sides of the interconnect layer, and an improvement comprising;
- a cavity within the interconnect layer and located vertically between the upper and lower surfaces of the interconnect layer and horizontally between edges of the interconnect layer which define the cavity;
- a capacitor embedded within the cavity, the capacitor comprising top and bottom vertically-spaced plates separated by capacitor dielectric material, one of the top or bottom capacitor plates electrically connected to the interconnect layer within the cavity, one of the top or bottom capacitor plates horizontally spaced from the edges defining the cavity; and
- an electrical connector extending through one of the IMD layers contacting the interconnect layer, the electrical connector electrically connected to the other one of the top or bottom capacitor plates.

2. An IC as defined in claim 1, wherein:
the interconnect layer includes upper, middle and lower conductive layers formed of metal, the middle conductive layer being relatively thicker vertically than either the upper or lower conductive layers; and
the cavity is located principally within the middle conductive layer.

3. An IC as defined in claim 2 wherein the middle conductive layer includes aluminum which is subject to deformation under temperature changes due to thermal processing of the IC.

4. An IC as defined in claim 2 wherein:
the cavity extends through the middle conductive layer to the lower conductive layer; and
the lower conductive layer defines the lower extent of the cavity.

5. An IC as defined in claim 4, wherein:
the bottom capacitor plate is formed by a portion of the lower conductive layer extending between the cavity edges.

6. An IC as defined in claim 5 wherein:
the bottom capacitor plate is integral with the lower conductive layer.

7. An IC as defined in claim 5 wherein:
the top plate is located vertically below or at the level of the upper surface of the interconnect layer.

8. An IC as defined in claim 7 wherein;
the top plate is horizontally spaced from the upper and middle conductive layers at the cavity edges; and further comprising:
an insulating fill material occupying the horizontal space between the top plate and the upper and middle conductive layers.

9. An IC as defined in claim 4 further comprising:
the top plate is horizontally spaced from the upper and middle conductive layers at the cavity edges; and further comprising:
an insulating fill material occupying the horizontal space between the top plate and the upper and middle conductive layers.

10. An IC as defined in claim 4 wherein:
the electrical connector extending through the IMD layer and connected to the capacitor plate comprises a via interconnect.

11. An IC as defined in claim 10 further comprising:
a second interconnect layer in addition to the interconnect layer first aforesaid, the second interconnect layer contacting one of the IMD layers which contacts the first interconnect layer; and wherein:
a second via interconnect in addition to the via interconnect first aforesaid which is connected to the capacitor plate, the second via interconnect extending through the same IMD layer as the first via interconnect, the second via interconnect electrically connected between the first and second interconnect layers; and
the first via interconnect extends between the first and second interconnect layers.

12. An IC as defined in claim 11 further comprising:
the first and second via interconnect are approximately the same length.

13. An IC as defined in claim 1, wherein:
a lower portion of the interconnect layer defines the lower extent of the cavity.

14. An IC as defined in claim 13 wherein:
the bottom capacitor plate is formed by a portion of the portion of the interconnect layer which defines the lower extent of the cavity.

15. An IC as defined in claim 14 wherein:
the bottom capacitor plate is integral with the portion of the interconnect layer which defines the lower extent of the cavity.

16. An IC as defined in claim 14 wherein:
the top plate is located vertically below or at the level of the upper surface of the interconnect layer.

17. An IC as defined in claim 14 wherein:
the top plate is horizontally spaced from the cavity edges; and further comprising:
an insulating fill material occupying the horizontal space between the top plate and the upper and middle conductive layers.

18. An IC as defined in claim 13 wherein:
the electrical connector extending through the IMD layer and connected to the capacitor plate comprises a via interconnect.

19. An IC as defined in claim 18 further comprising:
a second interconnect layer in addition to the interconnect layer first aforesaid, the second interconnect layer contacting one of the IMD layers which contacts the first interconnect layer; and wherein:
a second via interconnect in addition to the via interconnect first aforesaid which is connected to the capacitor plate, the second via interconnect extending through the same IMD layer as the first via interconnect, the second via interconnect electrically connected between the first and second interconnect layers; and
the first via interconnect extends between the first and second interconnect layers.

20. An IC as defined in claim 19 further comprising:
the first and second via interconnect are approximately the same length.

* * * * *